(12) United States Patent
Wang

(10) Patent No.: US 11,395,425 B2
(45) Date of Patent: Jul. 19, 2022

(54) FLEXIBLE DISPLAY PANEL

(71) Applicant: Wuhan China Star Optoelectronics Semiconductor Display Technology Co., Ltd., Wuhan (CN)

(72) Inventor: Fang Wang, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 253 days.

(21) Appl. No.: 16/638,755

(22) PCT Filed: Oct. 18, 2019

(86) PCT No.: PCT/CN2019/111995
§ 371 (c)(1),
(2) Date: Feb. 13, 2020

(87) PCT Pub. No.: WO2021/027058
PCT Pub. Date: Feb. 18, 2021

(65) Prior Publication Data
US 2021/0385959 A1    Dec. 9, 2021

(30) Foreign Application Priority Data

Aug. 12, 2019 (CN) .......................... 201910738597.2

(51) Int. Cl.
*H05K 5/00* (2006.01)
*H05K 5/03* (2006.01)

(52) U.S. Cl.
CPC ............. *H05K 5/03* (2013.01); *H05K 5/0017* (2013.01)

(58) Field of Classification Search
CPC ........ C08J 2383/04; C08J 7/042; C08J 7/046; G02F 1/133305; G02F 1/133345;
(Continued)

(56) References Cited

U.S. PATENT DOCUMENTS

2005/0158480 A1* 7/2005 Goodwin ................ C23C 4/123
427/569
2015/0048349 A1   2/2015 Kawata et al.
(Continued)

FOREIGN PATENT DOCUMENTS

CN        106652802        5/2017
CN        107452284        12/2017
(Continued)

*Primary Examiner* — Timothy J Thompson
*Assistant Examiner* — Guillermo J Egoavil

(57) ABSTRACT

A flexible display panel is provided, including a display component layer, a protection cover, and a backplane. The protection cover and the backplane are respectively disposed on opposite sides of the display component layer. The protection cover includes a first section corresponding to a bending area and a second section corresponding to a non-bending area. The first section includes a plurality of first sub-sections and a plurality of second sub-sections which are alternately arranged. The plurality of first sub-sections of the first section are made of a flexible material, and the plurality of second sub-sections of the first section and second sections are made of a rigid material. By setting the protection cover with multi-section design, the protection cover can correspondingly exhibit better bending performance and better hardness performance.

9 Claims, 2 Drawing Sheets

(58) Field of Classification Search
CPC .................. G06F 1/1652; G06F 1/181; H01L 2251/5338; H01L 51/0097; H01L 51/5253; H01L 51/5256; H05K 5/0017; H05K 5/03; H05K 5/00; G09F 9/301
USPC .................. 361/679.01, 679.02; 257/790
See application file for complete search history.

(56) References Cited

U.S. PATENT DOCUMENTS

| | | |
|---|---|---|
| 2016/0226024 A1* | 8/2016 | Park .................. H01L 51/0097 |
| 2019/0051223 A1 | 2/2019 | Li et al. |
| 2019/0148670 A1* | 5/2019 | Wang ................ G02F 1/133345 |
| | | 257/790 |
| 2019/0173030 A1 | 6/2019 | Kim et al. |
| 2020/0044171 A1 | 2/2020 | Hu et al. |
| 2021/0365083 A1* | 11/2021 | Li ........................... C08J 7/046 |

FOREIGN PATENT DOCUMENTS

| | | | |
|---|---|---|---|
| CN | 107578707 | 1/2018 | |
| CN | 108831305 | 11/2018 | |
| CN | 109859622 | 6/2019 | |
| CN | 109377887 | 9/2019 | |
| JP | 2013256587 A * | 12/2013 | ................ C08J 5/18 |

* cited by examiner

FLEXIBLE DISPLAY PANEL

RELATED APPLICATIONS

This application is a National Phase of PCT Patent Application No. PCT/CN2019/111995 having International filing date of Oct. 18, 2019, which claims the benefit of priority of Chinese Patent Application No. 201910738597.2 filed on Aug. 12, 2019. The contents of the above applications are all incorporated by reference as if fully set forth herein in their entirety.

FIELD AND BACKGROUND OF THE DISCLOSURE

The present disclosure relates to the field of display technologies, and in particular to a flexible display panel.

Products can be made into bendable by using a flexible display technology so that they have attracted market attention. A flexible display panel using the flexible display technology can be bent into a small-size screen when it is not used, and can be expanded into a large-size screen when it is used, thereby achieving transformation between large and small screens. However, in order to achieve this bending property, a conventional glass protection cover is no longer sufficient, and a flexible organic material must be used as a protective cover (i.e., a cover window) of an outermost layer of the flexible display panel. Although the flexible protection cover increases a bending performance of the flexible display panel, it reduces performances of the flexible display panel in accepting external impact and scratch resistance, which results in a risk that the flexible display panel will fail due to a collision or drop.

Accordingly, it is necessary to provide a flexible display panel to solve the problems in the prior art.

SUMMARY OF THE INVENTION

In order to solve the above problems of the prior art, an object of the present disclosure is to provide a flexible display panel which has good bending performance and resistance against external impact and scratch.

In order to achieve the above object, the present disclosure provides a flexible display panel, including a bending area, a non-bending area, a display component layer, a protection cover, and a backplane. The display component layer includes a first surface and a second surface opposite to the first surface. The protection cover is disposed on the first surface of the display component layer. The protection cover includes a first section corresponding to the bending area and a second section corresponding to the non-bending area. The first section includes a plurality of first sub-sections and a plurality of second sub-sections which are alternately arranged. The plurality of first sub-sections of the first section are made of a flexible material, and the plurality of second sub-sections of the first section and the second section are made of a rigid material. The backplane is disposed on the second surface of the display component layer. The backplane is composed of a plurality of first organic materials and a plurality of second organic materials which are alternately arranged. A Young's modulus of each the second organic material is less than a Young's modulus of each the first organic material. The display component layer, the protection cover, and the backplane are stacked one on another in a first direction, and the plurality of first sub-sections and the plurality of second sub-sections of the protection cover are alternately arranged along a second direction. The first direction is perpendicular to the second direction.

In one preferable embodiment of the present disclosure, a width of the first section of the protection cover ranges from 1 cm to 1.5 cm, a width of one of the first sub-sections is less than or equal to 1 mm, and a width of one of the second sub-sections ranges from 1 mm to 2 mm.

In one preferable embodiment of the present disclosure, one of the second organic materials is located in the non-bending area of the flexible display panel and is adjacent to the bending area.

The present disclosure also provides a flexible display panel, including a bending area, a non-bending area, a display component layer, a protection cover, and a backplane. The display component layer includes a first surface and a second surface opposite to the first surface. The protection cover is disposed on the first surface of the display component layer. The protection cover includes a first section corresponding to the bending area and a second section corresponding to the non-bending area, and the first section includes a plurality of first sub-sections and a plurality of second sub-sections which are alternately arranged. The plurality of first sub-sections of the first section are made of a flexible material, and the plurality of second sub-sections of the first section and the second section are made of a rigid material. The backplane is disposed on the second surface of the display component layer.

In one preferable embodiment of the present disclosure, the display component layer, the protection cover, and the backplane are stacked one on another in a first direction, and the plurality of first sub-sections and the plurality of second sub-sections of the protection cover are alternately arranged along a second direction, and the first direction is perpendicular to the second direction.

In one preferable embodiment of the present disclosure, a width of the first section of the protection cover ranges from 1 cm to 1.5 cm, a width of one of the first sub-sections is less than or equal to 1 mm, and a width of one of the second sub-sections ranges from 1 mm to 2 mm.

In one preferable embodiment of the present disclosure, the backplane is composed of a plurality of first organic materials and a plurality of second organic materials which are alternately arranged, and a Young's modulus of each the second organic material is less than a Young's modulus of each the first organic material.

In one preferable embodiment of the present disclosure, one of the second organic materials is located in the non-bending area of the flexible display panel and is adjacent to the bending area.

The present disclosure also provides a flexible display panel, including a bending area, a non-bending area, a display component layer, a protection cover, and a backplane. The display component layer includes a first surface and a second surface opposite to the first surface. The protection cover is disposed on the first surface of the display component layer. The backplane is disposed on the second surface of the display component layer. The backplane is composed of a plurality of first organic materials and a plurality of second organic materials which are alternately arranged, and a Young's modulus of each the second organic material is less than a Young's modulus of each the first organic material.

In one preferable embodiment of the present disclosure, one of the second organic materials is located in the non-bending area of the flexible display panel and is adjacent to the bending area.

In one preferable embodiment of the present disclosure, the display component layer, the protection cover, and the backplane are stacked one on another in a first direction, and the plurality of first organic materials and the plurality of second organic materials of the protection cover are alternately arranged along a second direction, and the first direction is perpendicular to the second direction.

In one preferable embodiment of the present disclosure, the protection cover includes a first section corresponding to the bending area and a second section corresponding to the non-bending area, and the first section includes a plurality of first sub-sections and a plurality of second sub-sections which are alternately arranged. The plurality of first sub-sections of the first section are made of a flexible material, and the plurality of second sub-sections of the first section and the second section are made of a rigid material In one preferable embodiment of the present disclosure, a width of the first section of the protection cover ranges from 1 cm to 1.5 cm, a width of one of the first sub-sections is less than or equal to 1 mm, and a width of one of the second sub-sections ranges from 1 mm to 2 mm.

In comparison to prior art, the present disclosure provides the protection cover and the backplane on both sides of the display component layer, and the protection cover and the backplane have a multi-section design, so that the protection cover and the backplane exhibit better bending performance in the bending area of the flexible display panel, and exhibit better hardness performance in the non-bending area of the flexible display panel.

DESCRIPTION OF SPECIFIC EMBODIMENTS OF THE INVENTION

The structure and the technical means adopted by the present disclosure to achieve the above and other objects can be best understood by referring to the following detailed description of the preferred embodiments and the accompanying drawings.

Figure 1:
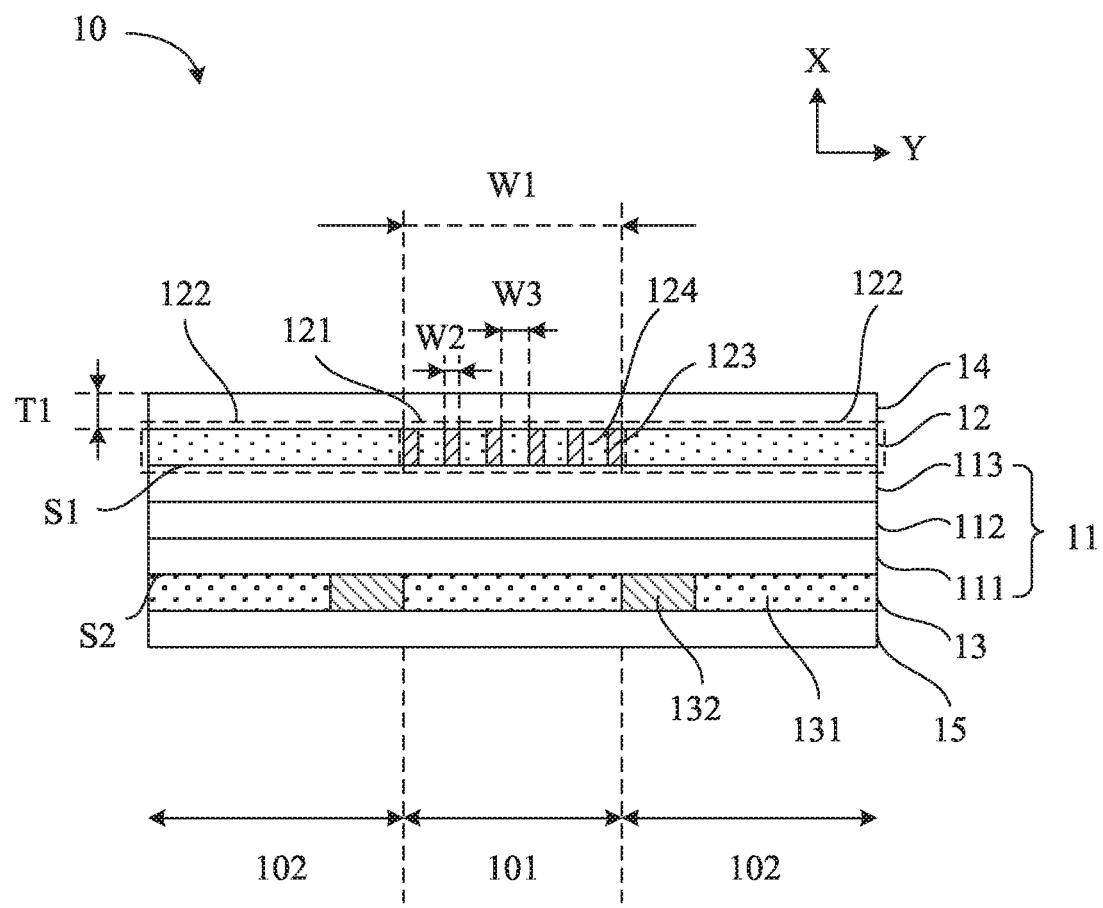
FIG. 1 is a schematic diagram of a flexible display panel of a first preferred embodiment of the present disclosure.

Please refer to FIG. 1, which is a schematic diagram of a flexible display panel 10 of a first preferred embodiment of the present disclosure. The flexible display panel 10 is suitable for bendable devices such as mobile phones, tablets, computer's displays, etc. The flexible display panel 10 defines a bending area 101 and a pair of non-bending areas 102. Preferably, the pair of non-bending areas 102 respectively serve as a primary display screen and a secondary display screen of the flexible display panel 10, and opposite ends of the bending area 101 are respectively connected to the primary display screen and the secondary display screen. By a bending operation of the bending area 101, the pair of non-bending areas 102 of the flexible display panel 10 can be set to be in an unfolded state in which they are arranged side-by-side, or can be set to be in a folded state in which they are stacked with each other, thereby realizing transformation of different display sizes.

As shown in FIG. 1, the flexible display panel 10 includes a display component layer 11, a protection cover 12, a backplane 13, a planarization layer 14, and a supporting layer 15. The display component layer 11 includes a first surface S1 and a second surface S2 opposite to the first surface S1. The display component layer 11 displays terminal data information (e.g., image, text, etc.) on the first surface S1. Optionally, the display component layer 11 includes thin film transistors, transparent electrodes, organic light-emitting materials, metal electrodes, an encapsulation layer, and the like. In the first preferred embodiment of the present disclosure, the display component layer 11 further includes a touch layer 112 and a polarizer 113. The touch layer 112 is configured to receive an input instruction of an user, and control and implement a corresponding display of the flexible display panel 10 according to the instruction. The polarizer 113 can be configured to convert light passing through the polarizer 113 into linearly polarized light of a specific polarization direction.

As shown in FIG. 1, the protection cover 12 is disposed on the first surface S1 of the display component layer 11, and the backplane 13 is disposed on the second surface S2 of the display component layer 11. In the present disclosure, the display component layer 11, the protection cover 12, and the backplane 13 are stacked one on another in a first direction X. Also, the protection cover 12 includes a first section 121 and second sections 122 alternately arranged along a second direction Y. The first direction X is perpendicular to the second direction Y. In this embodiment, the protection cover 12 includes a first section 121 and two second sections 122. The first section 121 corresponds to the bending area 101 of the flexible display panel 10, and the two second sections 122 respectively correspond to the pair of non-bending areas 102 of the flexible display panel 10. Furthermore, the first section 121 of the protection cover 12 includes a plurality of first sub-sections 123 and a plurality of second sub-sections 124. The plurality of first sub-sections 123 and the plurality of second sub-sections 124 are alternately arranged along the second direction Y. In the present disclosure, the plurality of first sub-sections 123 of the first section 121 are made of a flexible material. Preferably, the flexible material is selected from organic materials having high elasticity and high viscosity. Moreover, the plurality of second sub-sections 124 of the first section 121 and second sections 122 are all made of a rigid material, such as glass, but are not limited thereto. Therefore, in the present disclosure, the second section 122 of the protection cover 12 corresponding to the non-bending area 102 of the flexible display panel 10 is made of the rigid material, so that the protection cover 12 has good resistance against external impact and scratch.

In the present disclosure, a main function of the protection cover 12 is to achieve a certain protection for an inner layer structure of the flexible display panel 10 (such as the display component layer 11). Moreover, whether the flexible display panel 10 is folded inwardly (inwardly squeezed) or folded outwardly (outwardly stretched), the stress and deformation of the protective cover 12 are greater than those of the inner layer structure. Therefore, in order to make the protection cover 12 have good bending performance and resistance against external impact and scratch, the protection cover 12 of the present disclosure adopts the above-mentioned multi-section design, so that the protection cover 12 exhibits better bending performance in the bending area 101, and exhibits better hardness performance in the non-bending area 102. On the other hand, in order to achieve various shapes and bending forms, the protection cover 12 can adopt different multi-section designs corresponding to different products, such as modifying a spacing between each section, materials of the sections, positions of the sections, etc., so that it can be applied to the fields of flexible organic light-emitting diode displays, liquid crystal displays, micro light-emitting diode displays, and the like. For example, as shown in FIG. 1, in order to make the first section 121 and the second section 122 of the protection cover 12 have similar optical characteristics, a width W2 of each the first sub-section 123 is set to be less than a width W3 of each the second sub-section 124. In one embodiment, a width W1 of the first section 121 of the protection cover 12 is ranges from 1 cm to 1.5 cm, and the width W2 of each the first sub-section 123 is less than or equal to 1 mm, and the width W3 of the second sub-section 124 ranges from 1 mm to 2 mm.

As shown in FIG. 1, in order to planarize a surface of the protection cover 12, a planarization layer 14 is disposed on the protection cover 12. Preferably, the planarization layer 14 is an anti-fingerprint nano-plating layer having a thickness T1 of less than or equal to 100 nanometers. In this embodiment, the planarization layer 14 covers entire surface of protection cover 12. However, in another embodiment, the planarization layer 14 may only cover the first section 121 of the protection cover 12, that is, the planarization layer 14 is only disposed at the bending area 101 of the flexible display panel 10.

As shown in FIG. 1, the backplane 13 is disposed on the second surface S2 of the display component layer 11. Similarly, the backplane 13 is located on an outside of the flexible display panel 10, and the stress and deformation of the backplane 13 are greater than that of the inner layer structure. Therefore, the backplane 13 must also have good bending performance. In the present disclosure, the backplane 13 is composed of a plurality of first organic materials 131 and a plurality of second organic materials 132 which are alternately arranged. The second organic materials 132 are located in the non-bending area 102 of the flexible display panel 10 and adjacent to the bending area 101. It should be noted that a Young's modulus of each the second organic material 132 is less than a Young's modulus of each the first organic material 131. The second organic material 132 with a low Young's modulus is softer than the first organic material 131 with a high Young's modulus, so that when the backplane 13 is bent, the second organic materials 132 can effectively cushion the stress near the bending area 101, thereby exhibiting a best bending performance. Optionally, a width of each the second organic material 132 of the backplane 13 is set to about 2 cm. However, the specific width may be adjusted according to an actual size of the flexible display panel 10, and is not limited thereto.

As shown in FIG. 1, the supporting layer 15 is disposed on one side of the backplane 13 for functioning as a support for the flexible display panel 10. Preferably, the supporting layer 15 is made of metal.

Figure 2:
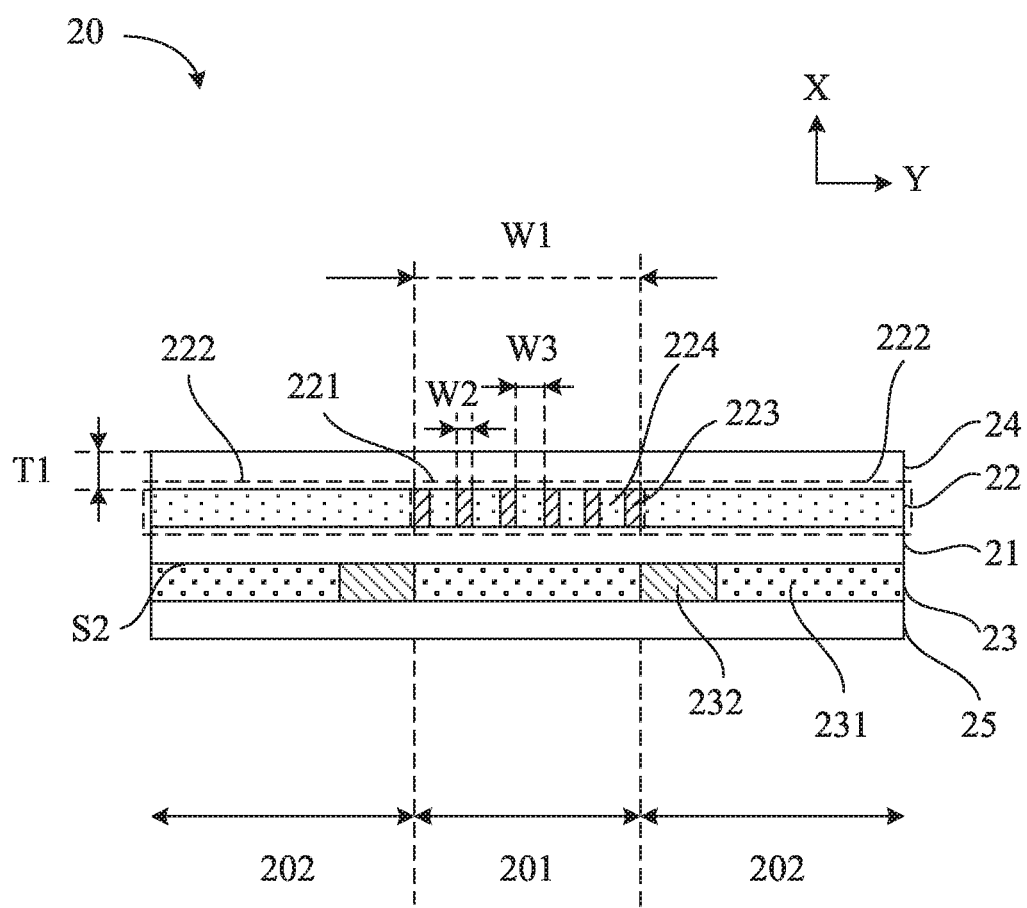
FIG. 2 is a schematic diagram of a flexible display panel of a second preferred embodiment of the present disclosure.

Please refer to FIG. 2, which is a schematic diagram of a flexible display panel 20 of a second preferred embodiment of the present disclosure. The flexible display panel 20 is suitable for bendable devices such as mobile phones, tablets, computer's displays, etc. The flexible display panel 20 defines a bending area 201 and a pair of non-bending areas 202. Preferably, the pair of non-bending areas 202 respectively serve as a primary display screen and a secondary display screen of the flexible display panel 20, and opposite ends of the bending area 201 are respectively connected to the primary display screen and the secondary display screen. By a bending operation of the bending area 201, the pair of non-bending areas 202 of the flexible display panel 20 can be set to be in an unfolded state in which they are arranged side-by-side, or can be set to be in a folded state in which they are stacked with each other, thereby realizing transformation of different display sizes.

As shown in FIG. 2, the flexible display panel 20 includes a display component layer 21, a protection cover 22, a backplane 23, a planarization layer 24, and a supporting layer 25. The display component layer 21 includes a first surface S1 and a second surface S2 opposite to the first surface S1. The display component layer 21 displays terminal data information (e.g., image, text, etc.) on the first surface S1. Optionally, the display component layer 11 includes thin film transistors, transparent electrodes, organic light-emitting materials, metal electrodes, an encapsulation layer, and the like. In the second preferred embodiment of the present disclosure, the flexible display panel 20 adopts new technologies such as no polarizers and quantum dots, so that the polarizer and a touch layer in a conventional display panel can be omitted, thereby reducing a thickness of the flexible display panel 20.

As shown in FIG. 2, the protection cover 22 is disposed on the first surface S1 of the display component layer 21, and the backplane 23 is disposed on the second surface S2 of the display component layer 21. In the present disclosure, the display component layer 21, the protection cover 22, and the backplane 23 are stacked one on another in a first direction X. Also, the protection cover 22 includes a first section 221 and second sections 222 alternately arranged along a second direction Y. The first direction X is perpendicular to the second direction Y. In this embodiment, the protection cover 22 includes a first section 221 and two second sections 222. The first section 221 corresponds to the bending area 201 of the flexible display panel 20, and the two second sections 222 respectively correspond to the pair of non-bending areas 202 of the flexible display panel 20. Furthermore, the first section 221 of the protection cover 22 includes a plurality of first sub-sections 223 and a plurality of second sub-sections 224. The plurality of first sub-sections 223 and the plurality of second sub-sections 224 are alternately arranged along the second direction Y. In the present disclosure, the plurality of first sub-sections 223 of the first section 221 are made of a flexible material. Preferably, the flexible material is selected from organic materials having high elasticity and high viscosity. Moreover, the plurality of second sub-sections 224 of the first section 221 and second sections 222 are all made of a rigid material, such as glass, but are not limited thereto. Therefore, in the present disclosure, the second section 222 of the protection cover 22 corresponding to the non-bending area 202 of the flexible display panel 20 is made of the rigid material, so that the protection cover 22 has good resistance against external impact and scratch.

In the present disclosure, a main function of the protection cover 22 is to achieve a certain protection for an inner layer structure of the flexible display panel 20 (such as the display component layer 21). Moreover, whether the flexible display panel 20 is folded inwardly (inwardly squeezed) or folded outwardly (outwardly stretched), the stress and deformation of the protective cover 22 are greater than those of the inner layer structure. Therefore, in order to make the protection cover 22 have good bending performance and resistance against external impact and scratch, the protection cover 22 of the present disclosure adopts the above-mentioned multi-section design, so that the protection cover 22 exhibits better bending performance in the bending area 201, and exhibits better hardness performance in the non-bending area 202. On the other hand, in order to achieve various shapes and bending forms, the protection cover 12 can adopt different multi-section designs corresponding to different products, such as modifying a spacing between each section, materials of the sections, positions of the sections, etc., so that it can be applied to the fields of flexible organic light-emitting diode displays, liquid crystal displays, micro light-emitting diode displays, and the like. For example, as shown in FIG. 2, in order to make the first section 221 and the second section 222 of the protection cover 22 have similar optical characteristics, a width W2 of each the first sub-section 223 is set to be less than a width W3 of each the second sub-section 224. In one embodiment, a width W1 of the first section 221 of the protection cover 22 is ranges from 1 cm to 1.5 cm, and the width W2 of each the first sub-section 223 is less than or equal to 1 mm, and the width W3 of the second sub-section 224 ranges from 1 mm to 2 mm.

As shown in FIG. 2, in order to planarize a surface of the protection cover 22, a planarization layer 24 is disposed on the protection cover 22. Preferably, the planarization layer 24 is an anti-fingerprint nano-plating layer having a thickness T1 of less than or equal to 100 nanometers. In this embodiment, the planarization layer 24 covers entire surface of protection cover 22. However, in another embodiment, the planarization layer 24 may only cover the first section 221 of the protection cover 22, that is, the planarization layer 24 is only disposed at the bending area 201 of the flexible display panel 20.

As shown in FIG. 2, the backplane 23 is disposed on the second surface S2 of the display component layer 21. Similarly, the backplane 23 is located on an outside of the flexible display panel 20, and the stress and deformation of the backplane 23 are greater than that of the inner layer structure. Therefore, the backplane 23 must also have good bending performance. In the present disclosure, the backplane 23 is composed of a plurality of first organic materials 231 and a plurality of second organic materials 232 which are alternately arranged. The second organic materials 232 are located in the non-bending area 202 of the flexible display panel 20 and adjacent to the bending area 201. It should be noted that a Young's modulus of each the second organic material 232 is less than a Young's modulus of each the first organic material 231. The second organic material 232 with a low Young's modulus is softer than the first organic material 231 with a high Young's modulus, so that when the backplane 23 is bent, the second organic materials 232 can effectively cushion the stress near the bending area 201, thereby exhibiting a best bending performance. Optionally, a width of each the second organic material 232 of the backplane 23 is set to about 2 cm. However, the specific width may be adjusted according to an actual size of the flexible display panel 20, and is not limited thereto.

As shown in FIG. 2, the supporting layer 25 is disposed on one side of the backplane 23 for functioning as a support for the flexible display panel 20. Preferably, the supporting layer 25 is made of metal.

In summary, the present disclosure provides the protection cover and the backplane on both sides of the display component layer, and the protection cover and the backplane have a multi-segment design, so that the protection cover and the backplane exhibit better bending performance in the bending area of the flexible display panel, and exhibit better hardness performance in the non-bending area of the flexible display panel.

The above descriptions are merely preferable embodiments of the present disclosure, and are not intended to limit the scope of the present disclosure. Any modification or replacement made by those skilled in the art without departing from the spirit and principle of the present disclosure should fall within the protection scope of the present disclosure.

What is claimed is:

1. A flexible display panel, comprising:
   a bending area;
   a non-bending area;
   a display component layer comprising a first surface and a second surface opposite to the first surface;
   a protection cover disposed on the first surface of the display component layer, wherein the protection cover comprises a first section corresponding to the bending area and a second section corresponding to the non-bending area, and the first section comprises a plurality of first sub-sections and a plurality of second sub-sections which are alternately arranged; and wherein the plurality of first sub-sections of the first section are made of a flexible material, and the plurality of second sub-sections of the first section and the second section are made of a rigid material; and
   wherein a width of the first section of the protection cover ranges from 1 cm to 1.5 cm, a width of one of the first sub-sections is less than or equal to 1 mm, and a width of one of the second sub-sections ranges from 1 mm to 2 mm; and
   a backplane disposed on the second surface of the display component layer, wherein the backplane is composed of a plurality of first organic materials and a plurality of second organic materials which are alternately arranged, and a Young's modulus of each the second organic material is less than a Young's modulus of each the first organic material;
   wherein the display component layer, the protection cover, and the backplane are stacked one on another in a first direction, and the plurality of first sub-sections and the plurality of second sub-sections of the protection cover are alternately arranged along a second direction, and the first direction is perpendicular to the second direction.

2. The flexible display panel as claimed in claim 1, wherein one of the second organic materials is located in the non-bending area of the flexible display panel and is adjacent to the bending area.

3. A flexible display panel, comprising:
   a bending area;
   a non-bending area;
   a display component layer comprising a first surface and a second surface opposite to the first surface;
   a protection cover disposed on the first surface of the display component layer, wherein the protection cover comprises a first section corresponding to the bending area and a second section corresponding to the non-bending area, and the first section comprises a plurality of first sub-sections and a plurality of second sub-sections which are alternately arranged; and wherein the plurality of first sub-sections of the first section are made of a flexible material, and the plurality of second sub-sections of the first section and the second section are made of a rigid material; and
   wherein a width of the first section of the protection cover ranges from 1 cm to 1.5 cm, a width of one of the first sub-sections is less than or equal to 1 mm, and a width of one of the second sub-sections ranges from 1 mm to 2 mm; and
   a backplane disposed on the second surface of the display component layer.

4. The flexible display panel as claimed in claim 3, wherein the display component layer, the protection cover, and the backplane are stacked one on another in a first direction, and the plurality of first sub-sections and the plurality of second sub-sections of the protection cover are alternately arranged along a second direction, and the first direction is perpendicular to the second direction.

5. The flexible display panel as claimed in claim 3, wherein the backplane is composed of a plurality of first organic materials and a plurality of second organic materials which are alternately arranged, and a Young's modulus of each the second organic material is less than a Young's modulus of each the first organic material.

6. The flexible display panel as claimed in claim 3, wherein one of the second organic materials is located in the non-bending area of the flexible display panel and is adjacent to the bending area.

7. A flexible display panel, comprising:
a bending area;
a non-bending area;
a display component layer comprising a first surface and a second surface opposite to the first surface;
a protection cover disposed on the first surface of the display component layer, wherein the protection cover comprises a first section corresponding to the bending area and a second section corresponding to the non-bending area, and the first section comprises a plurality of first sub-sections and a plurality of second sub-sections which are alternately arranged, the plurality of first sub-sections of the first section are made of a flexible material, and the plurality of second sub-sections of the first section and the second section are made of a rigid material, wherein a width of the first section of the protection cover ranges from 1 cm to 1.5 cm, a width of one of the first sub-sections is less than or equal to 1 mm, and a width of one of the second sub-sections ranges from 1 mm to 2 mm; and
a backplane disposed on the second surface of the display component layer, wherein the backplane is composed of a plurality of first organic materials and a plurality of second organic materials which are alternately arranged, and a Young's modulus of each the second organic material is less than a Young's modulus of each the first organic material.

8. The flexible display panel as claimed in claim 7, wherein one of the second organic materials is located in the non-bending area of the flexible display panel and is adjacent to the bending area.

9. The flexible display panel as claimed in claim 7, wherein the display component layer, the protection cover, and the backplane are stacked one on another in a first direction, and the plurality of first organic materials and the plurality of second organic materials of the backplane are alternately arranged along a second direction, and the first direction is perpendicular to the second direction.

* * * * *